(12) United States Patent
Zhao et al.

(10) Patent No.: US 8,638,606 B2
(45) Date of Patent: Jan. 28, 2014

(54) SUBSTRATE BIAS DURING PROGRAM OF NON-VOLATILE STORAGE

(75) Inventors: Dengtao Zhao, Santa Clara, CA (US); Guirong Liang, Santa Clara, CA (US); Deepanshu Dutta, Santa Clara, CA (US)

(73) Assignee: SanDisk Technologies Inc., Plano, TX (US)

( * ) Notice: Subject to any disclaimer, the term of this patent is extended or adjusted under 35 U.S.C. 154(b) by 346 days.

(21) Appl. No.: 13/234,539

(22) Filed: Sep. 16, 2011

(65) Prior Publication Data

US 2013/0070531 A1 Mar. 21, 2013

(51) Int. Cl.
*G11C 11/34* (2006.01)
*G11C 16/04* (2006.01)

(52) U.S. Cl.
USPC ............ 365/185.17; 365/185.14; 365/185.27; 365/195

(58) Field of Classification Search
USPC ................... 365/185.17, 185.14, 185.27, 195
See application file for complete search history.

(56) References Cited

U.S. PATENT DOCUMENTS

| | | | |
|---|---|---|---|
| 6,160,286 A | 12/2000 | Chi | |
| 6,366,499 B1 | 4/2002 | Wang et al. | |
| 6,525,964 B2 | 2/2003 | Tanaka et al. | |
| 6,771,536 B2 | 8/2004 | Li et al. | |
| 6,859,397 B2 | 2/2005 | Lutze et al. | |
| 7,023,733 B2 | 4/2006 | Guterman et al. | |
| 7,161,833 B2 | 1/2007 | Hemink | |
| 7,436,709 B2 | 10/2008 | Higashitani | |
| 7,460,404 B1 | 12/2008 | Dong et al. | |
| 7,489,554 B2 | 2/2009 | Nguyen et al. | |
| 7,583,535 B2 | 9/2009 | Sekar et al. | |
| 7,583,539 B2 | 9/2009 | Sekar et al. | |
| 7,880,492 B2 | 2/2011 | Olofsson | |
| 2006/0198195 A1* | 9/2006 | Hemink et al. | 365/185.18 |
| 2008/0043528 A1* | 2/2008 | Isobe et al. | 365/185.03 |
| 2008/0158975 A1 | 7/2008 | Sekar et al. | |
| 2008/0158992 A1 | 7/2008 | Sekar et al. | |
| 2008/0159007 A1 | 7/2008 | Sekar et al. | |
| 2009/0067245 A1 | 3/2009 | Isobe et al. | |
| 2010/0195383 A1 | 8/2010 | Damle et al. | |
| 2011/0090739 A1 | 4/2011 | Goda et al. | |

FOREIGN PATENT DOCUMENTS

WO 2009143435 A1 11/2009

OTHER PUBLICATIONS

International Search Report and Written Opinion of the International Searching Authority dated Jan. 21, 2013, PCT Application No. PCT/US2012/055044, filed Sep. 13, 2012, 12 pages.

\* cited by examiner

*Primary Examiner* — Toan Le
(74) *Attorney, Agent, or Firm* — Vierra Magen Marcus LLP

(57) ABSTRACT

A programming technique which reduces program disturb in a non-volatile storage system is disclosed. A positive voltage may be applied to a substrate (e.g., p-well) during programming. Biasing the substrate may improve boosting of channels of unselected NAND strings, which may reduce program disturb. The substrate may be charged up during the programming operation, and discharged after programming. Therefore, for operations such as verify and read, the substrate may be grounded. In one embodiment, the substrate is charged just prior to applying a program pulse, then discharged prior to a program verify operation. In one embodiment, the substrate is charged while unselected word lines are ramped up to a pass voltage. The substrate bias may depend on program voltage, temperature, and/or hot count.

28 Claims, 15 Drawing Sheets

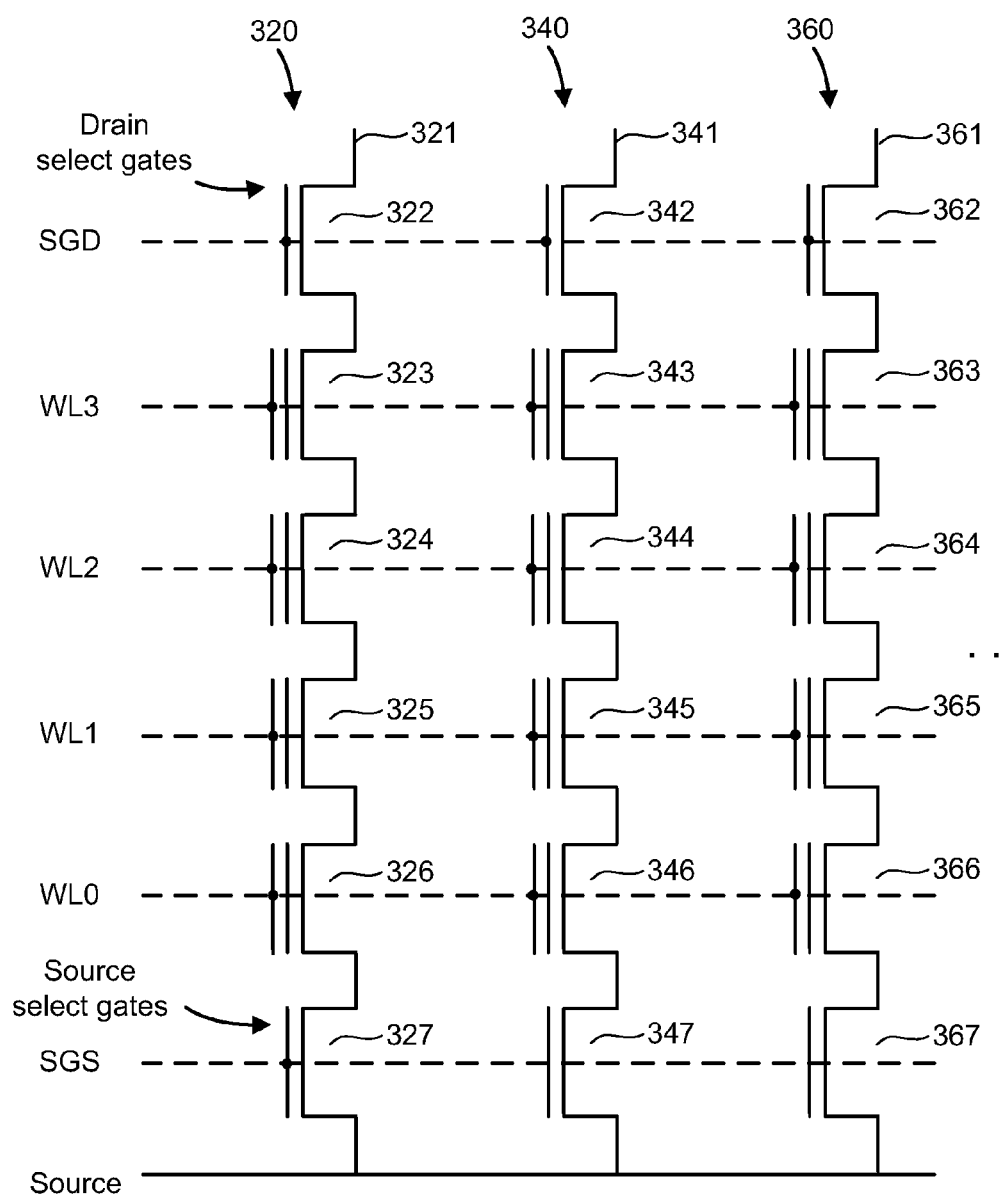

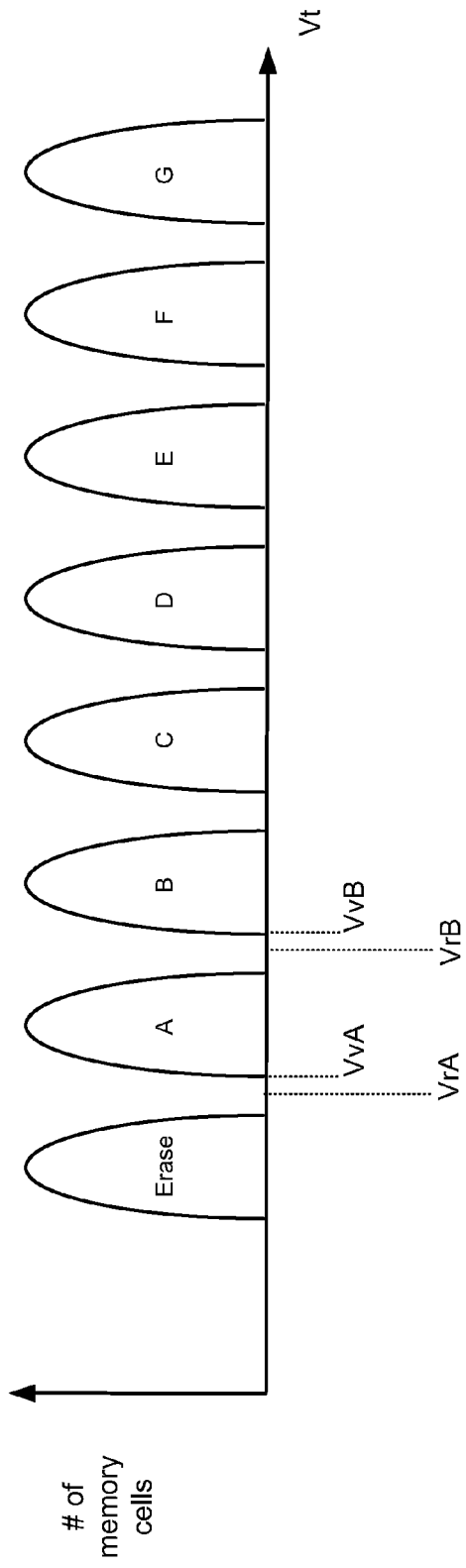
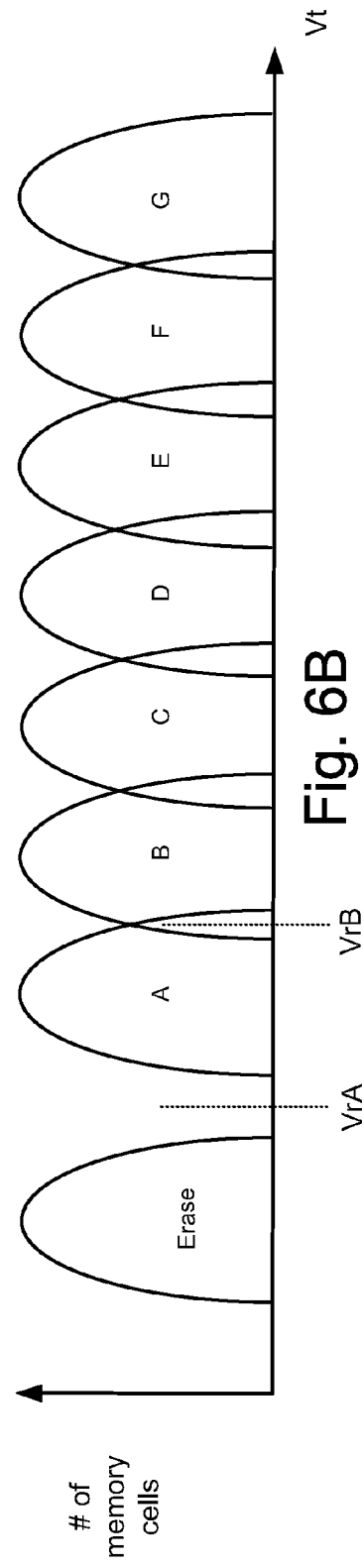

SUBSTRATE BIAS DURING PROGRAM OF NON-VOLATILE STORAGE

BACKGROUND

The present disclosure relates to non-volatile memory.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage ($V_{TH}$) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

Typically, a program voltage $V_{PGM}$ applied to the control gate during a program operation is applied as a series of pulses that increase in magnitude over time. In one possible approach, the magnitude of the pulses is increased with each successive pulse by a predetermined step size, e.g., 0.2-0.4 V. $V_{PGM}$ can be applied to the control gates of flash memory elements. In the periods between the program pulses, verify operations are carried out. That is, the programming level of each element of a group of elements being programmed in parallel is read between successive programming pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

Moreover, when programming an EEPROM or flash memory device, such as a NAND flash memory device in a NAND string, typically $V_{PGM}$ is applied to the control gate and the bit line is grounded, causing electrons from the channel of a cell or memory element, e.g., storage element, to be injected into the floating gate. When electrons accumulate in the floating gate, the floating gate becomes negatively charged and the threshold voltage of the memory element is raised so that the memory element is considered to be in a programmed state. More information about such programming can be found in U.S. Pat. Nos. 6,859,397 and 6,917,542, both of which are incorporated herein by reference in their entirety.

However, one issue which continues to be problematic is program disturb. Program disturb can occur at inhibited NAND strings during programming of other NAND strings, and sometimes at the programmed NAND string itself. Program disturb occurs when the threshold voltage of an unselected non-volatile storage element is shifted due to programming of other non-volatile storage elements. Program disturb can occur on previously programmed storage elements as well as erased storage elements that have not yet been programmed.

Moreover, as memory devices continue to scale down, program disturb may become worse. One conventional technique for mitigating program disturb is to boost channels of unselected non-volatile storage elements. This may reduce the voltage difference between the floating gate and the channel, thus reducing or eliminating program disturb. However, it may be more difficult to boost channels as memory devices scale down in size.

BRIEF DESCRIPTION OF THE DRAWINGS

FIG. 2 is a cross-sectional view of a NAND string.

FIG. 6A depicts an example set of Vt distributions.

FIG. 6B depicts an example set of Vt distributions.

DETAILED DESCRIPTION

The present disclosure provides a programming technique which reduces program disturb in a non-volatile storage system. A positive voltage is applied to a substrate (e.g., p-well) during programming, in accordance with one embodiment. Biasing the substrate may improve boosting of channels of unselected NAND strings, which may reduce program disturb. The substrate may be charged up during the programming operation, and discharged after programming. Therefore, for operations such as verify and read, the substrate may be grounded. In one embodiment, the substrate is charged just prior to applying a program pulse, then discharged prior to a program verify operation. In one embodiment, the substrate is charged while unselected word lines are ramped up to a pass voltage. In one embodiment, the substrate is charged while the selected word lines is ramped up to a program voltage. In one embodiment, the substrate bias depends on the magnitude of the programming voltage. In one embodiment, the substrate bias depends on temperature. In one embodiment, the substrate bias depends on program/erase cycle.

Figure 1A:
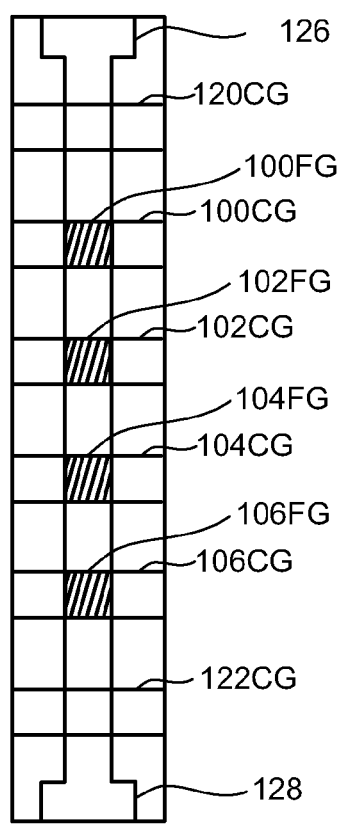
FIG. 1A is a top view of a NAND string.
Figure 1B:
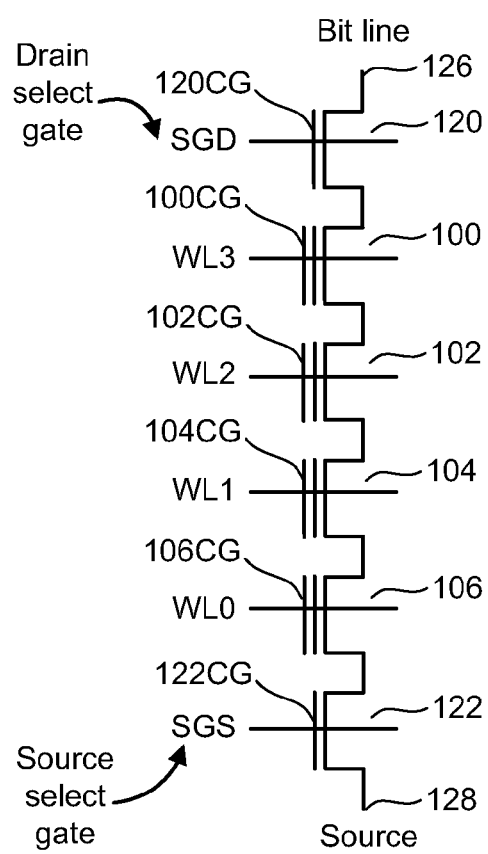
FIG. 1B is an equivalent circuit diagram of the NAND string of FIG. 1A.

One example of a memory system suitable for implementing the embodiments uses the NAND flash memory structure, which includes arranging multiple transistors in series between two select gates. The transistors in series and the select gates are referred to as a NAND string. FIG. 1A is a top view showing one NAND string. FIG. 1B is an equivalent circuit thereof. The NAND string depicted in FIGS. 1A and 1B includes four transistors, 100, 102, 104 and 106, in series and sandwiched between a first select gate 120 and a second select gate 122. Select gate 120 gates the NAND string connection to bit line 126. Select gate 122 gates the NAND string connection to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to (or is) word line WL3, control gate 102CG is connected to word line WL2, control gate 104CG is connected to word line WL1, and control gate 106CG is connected to word line WL0. In one embodiment, transistors 100, 102, 104 and 106 are each storage elements, also referred to as memory cells. In other embodiments, the storage elements may include multiple transistors or may be different than that depicted in FIGS. 1A and 1B. Select gate 120 is connected to select line SGD. Select gate 122 is connected to select line SGS.

FIG. 2 is a circuit diagram depicting three NAND strings. A typical architecture for a flash memory system using a NAND structure will include several NAND strings. For example, three NAND strings 320, 340 and 360 are shown in a memory array having many more NAND strings. Each of the NAND strings includes two select gates and four storage elements. While four storage elements are illustrated for simplicity, modern NAND strings can have up to thirty-two or sixty-four storage elements, for instance.

For example, NAND string 320 includes select gates 322 and 327, and storage elements 323-326, NAND string 340 includes select gates 342 and 347, and storage elements 343-346, NAND string 360 includes select gates 362 and 367, and storage elements 363-366. Each NAND string is connected to the source line by its select gates (e.g., select gates 327, 347 or 367). A selection line SGS is used to control the source side select gates. The various NAND strings 320, 340 and 360 are connected to respective bit lines 321, 341 and 361, by select transistors in the select gates 322, 342, 362, etc. These select transistors are controlled by a drain select line SGD. In other embodiments, the select lines do not necessarily need to be in common among the NAND strings; that is, different select lines can be provided for different NAND strings. Word line WL3 is connected to the control gates for storage elements 323, 343 and 363. Word line WL2 is connected to the control gates for storage elements 324, 344 and 364. Word line WL1 is connected to the control gates for storage elements 325, 345 and 365. Word line WL0 is connected to the control gates for storage elements 326, 346 and 366. As can be seen, each bit line and the respective NAND string comprise the columns of the array or set of storage elements. The word lines (WL3, WL2, WL1 and WL0) comprise the rows of the array or set. Each word line connects the control gates of each storage element in the row. Or, the control gates may be provided by the word lines themselves. For example, word line WL2 provides the control gates for storage elements 324, 344 and 364. In practice, there can be thousands of storage elements on a word line.

Each storage element can store data. For example, when storing one bit of digital data, the range of possible threshold voltages ($V_{TH}$) of the storage element is divided into two ranges which are assigned logical data "1" and "0." In one example of a NAND type flash memory, the $V_{TH}$ is negative after the storage element is erased, and defined as logic "1." The $V_{TH}$ after a program operation is positive and defined as logic "0." When the $V_{TH}$ is negative and a read is attempted, the storage element will turn on to indicate logic "1" is being stored. When the $V_{TH}$ is positive and a read operation is attempted, the storage element will not turn on, which indicates that logic "0" is stored. A storage element can also store multiple levels of information, for example, multiple bits of digital data. In this case, the range of $V_{TH}$ value is divided into the number of levels of data. For example, if four levels of information are stored, there will be four $V_{TH}$ ranges assigned to the data values "11", "10", "01", and "00." In one example of a NAND type memory, the $V_{TH}$ after an erase operation is negative and defined as "11". Positive $V_{TH}$ values are used for the states of "10", "01", and "00." The specific relationship between the data programmed into the storage element and the threshold voltage ranges of the element depends upon the data encoding scheme adopted for the storage elements. For example, U.S. Pat. Nos. 6,222,762 and 7,237,074, both of which are incorporated herein by reference in their entirety, describe various data encoding schemes for multi-state flash storage elements.

Relevant examples of NAND type flash memories and their operation are provided in U.S. Pat. Nos. 5,386,422, 5,570, 315, 5,774,397, 6,046,935, 6,456,528 and 6,522,580, each of which is incorporated herein by reference.

When programming a flash storage element, a program voltage is applied to the control gate of the storage element, and the bit line associated with the storage element is grounded. Electrons from the channel are injected into the floating gate. When electrons accumulate in the floating gate, the floating gate becomes negatively charged and the $V_{TH}$ of the storage element is raised. To apply the program voltage to the control gate of the storage element being programmed, that program voltage is applied on the appropriate word line. As discussed above, one storage element in each of the NAND strings share the same word line. For example, when programming storage element 324 of FIG. 2, the program voltage will also be applied to the control gates of storage elements 344 and 364.

However, program disturb can occur at inhibited NAND strings during programming of other NAND strings, and sometimes at the programmed NAND string itself. Program disturb occurs when the threshold voltage of an unselected non-volatile storage element is shifted due to programming of other non-volatile storage elements. Program disturb can occur on previously programmed storage elements as well as erased storage elements that have not yet been programmed. Various program disturb mechanisms can limit the available operating window for non-volatile storage devices such as NAND flash memory.

As one example of program disturb, if NAND string 320 is inhibited (e.g., it is an unselected NAND string which does not contain a storage element which is currently being programmed) and NAND string 340 is being programmed (e.g., it is a selected NAND string which contains a storage element which is currently being programmed), program disturb can occur at NAND string 320. For example, if the channel of the inhibited NAND string 320 is not well boosted while a program voltage is applied to a selected word line (e.g., WL2), then memory cell 324 might experience program disturb. In this example, there may be a large voltage difference between the channel of memory cell 324 and its control gate (due to programming voltage on WL2). Therefore, the floating gate of memory cell 324 might be unintentionally programmed.

As will be described below, the substrate is charged to a bias voltage during a program operation that uses self boosting (SB), in one embodiment. During programming using the SB scheme, the channel areas of the unselected NAND strings are electrically isolated from their corresponding bit lines. Subsequently an intermediate pass voltage (e.g. 10 volts) is applied to the unselected word lines while a high program voltage (e.g. 18 volts) is applied to the selected word line. In this application, the terms "isolate" and "electrically isolate" are used interchangeably, and the terms "writing voltage," "program voltage" and "programming voltage" are used interchangeably. The channel areas of the unselected NAND strings are capacitively coupled to the unselected word lines, causing a voltage (e.g. six volts, assuming a coupling ratio of 0.6) to exist in the channel areas of the unselected NAND strings. This so called "Self Boosting" reduces the potential difference between the channel areas of the unselected NAND strings and the program voltage that is applied to the selected word line. As a result, for the memory cells in the unselected NAND strings and especially for the memory cells in such strings on the selected word line, the voltage across the turned oxide and hence the program disturb are significantly reduced.

The following is a brief explanation of one embodiment of self boosting program technique to program one of the cells on bit line 341. In one embodiment, zero volts is applied to the bit line 321 and voltage Vdd (e.g. 3.3 volts) is applied to the bit lines 341 and 361. The voltage Vsg which may be much higher than Vdd may be applied to the drain select line SGD to turn on the transistors 322, 342, and 362 for a sufficient precharge, and zero volts may be applied to the source select line SGS to turn off transistors 327, 347, 367. A bias of Vdd may be applied to the unselected BL. Assuming that all of the memory cells in the array are in the normally on states (e.g., erased or negative threshold voltage state), the channel potential of all the memory cells in NAND string 340 is almost the same as Vdd, since SGD is well overdriven by Vsg. Voltage on SGD is then brought back down to $V_{SGD}$ which is slightly higher than Vdd and the drain side select transistor SGD is then shutoff since the NAND string channel has a higher potential then the difference between $V_{SGD}$ and Vdd. Therefore, the inhibited channel is now floating and is ready to be coupled up by control gate voltages. The above operation can be referred to as "pre-charging" since the channel potential is pre-charged to a predefined potential of about 3.3 V in this case. Since transistor 347 is turned off and transistor 342 will turn off automatically after the channel potential of the NAND string has reached a sufficiently high value (3.3V in this case) the channel potential of memory cells becomes floating. Therefore, when an intermediate voltage Vpass (e.g. 10 volts) is applied to the unselected word lines, the channel potential of memory cells is bootstrapped or boosted from 3.3 volts, the initial pre-charged level, to a value such as 8 volts, due to capacitive coupling, assuming a coupling ratio of about 0.6. In one embodiment, the substrate is charged to a positive voltage while the intermediate voltage Vpass is being applied, which may assist in boosting the channel. Even though a high voltage such as 18 volts is applied to the control gate of memory cell 344, the potential difference between such high voltage and the channel potential is not adequate to cause electron tunneling through the oxide to the floating gate of memory cell 344, thereby preventing program disturb.

In some embodiments, Vpass is applied to a subset of the unselected word lines, but a voltage other than Vpass is applied to other unselected as a part of the boosting scheme. In some cases, the voltage applied to the unselected word line may depend on its position. Techniques that apply different voltages to different unselected word lines during boosting includes, but are not limited to, local self boosting and erase area self boosting.

As will be described below, the substrate is charged to a bias voltage during a program operation that uses local self boosting (LSB), in one embodiment. The following is a brief explanation of one embodiment of local self boosting (LSB) program technique to program one of the cells on bit line 341. In the LSB scheme, when applying a high programming voltage to the selected word line WL2, in order to reduce or prevent program disturb in regard to memory cell 344 on a string that is inhibited, 0 volts are applied to word lines WL1 and WL3 so that memory cells 343 and 345 are turned off. Then the channel potential in memory cell 344 is not influenced, or at least less influenced, by the self boosting in the channel regions of memory cells 343, 345, and 346. Therefore, the channel potential of the channel region of memory cell 344 may be self boosted by the high programming voltage Vpgm to a voltage level that is higher than that achieved when the channel region of memory cell 344 is influenced by the self boosting in the remaining memory cells 343, 344, and 346. This prevents program disturb when memory cell 324 is being programmed. In one embodiment, the substrate is charged while the unselected word lines are being charged to their respective voltages. However, the substrate could be charged during another part of the program operation.

In one embodiment, the substrate is charged to a bias voltage during a program operation that uses erase area self-boosting (EASB). EASB differs from LSB in that, instead of turning off both memory cells on either side of the unselected cell to prevent program disturb of the cell as in LSB, EASB turns off only the memory cell on the source side of the unselected cell. For example, where memory cell 324 is being programmed, only memory cell 345 is being turned off without turning off memory cell 343, in order to prevent program disturb at cell. In one embodiment, the substrate is charged while the unselected word lines are being charged to their respective voltages. However, the substrate could be charged during another part of the program operation.

The following describe further details of various boosting schemes that apply a voltage other than Vpass to some unselected words lines: U.S. Pat. No. 6,859,397, filed on Mar. 5, 2003, to Lutze, et al., entitled, "Source Side Self Boosting Technique for Non-Volatile Memory"; U.S. Pat. No. 7,460, 404, filed on May 7, 2007, to Dong et al., entitled "Boosting for Non-Volatile Storage Using Channel Isolation Switching"; U.S. Pat. No. 7,436,709, filed on May 5, 2007, to Higashitani, entitled, "NAND Flash Memory with Boosting"; all said Patents are hereby incorporated by reference for all purposes.

Figure 3A:
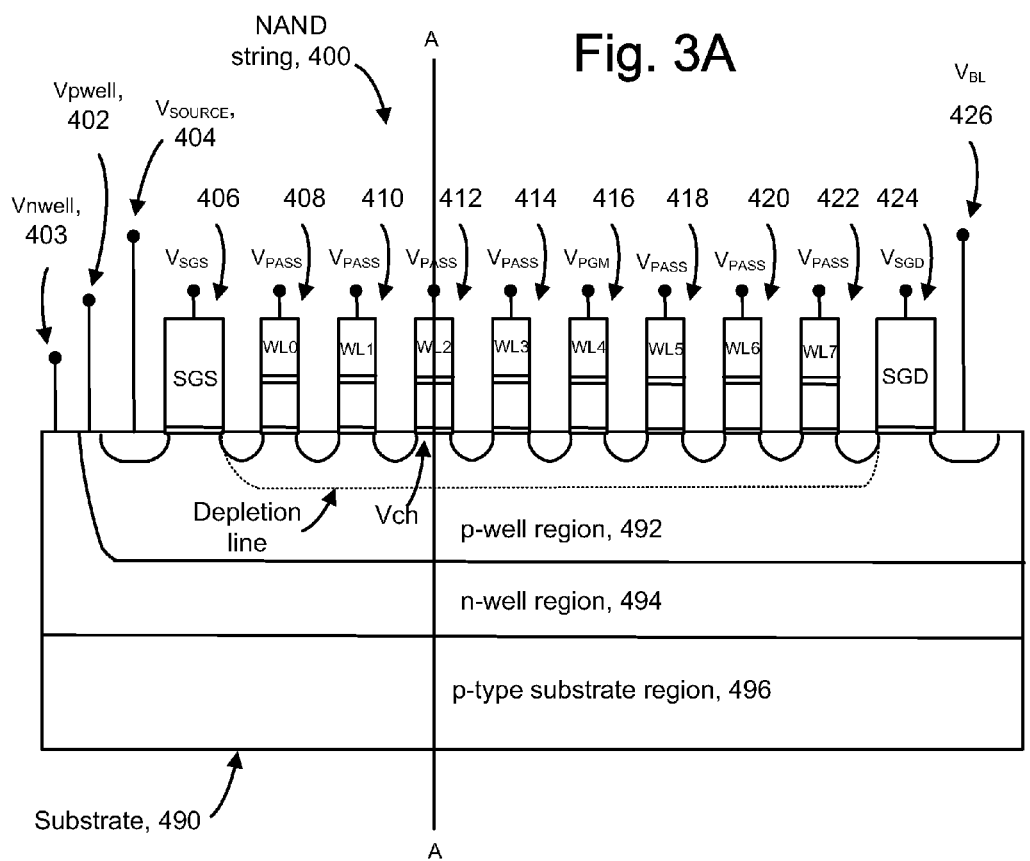
FIG. 3A depicts a cross-sectional view of a NAND string formed on a substrate.

FIG. 3A depicts a cross-sectional view of a NAND string formed on a substrate. The view is simplified and not to scale. The NAND string 400 includes a source-side select gate 406, a drain-side select gate 424, and eight storage elements 408, 410, 412, 414, 416, 418, 420 and 422, formed on a substrate 490. A number of source/drain regions, one example of which is source drain/region 430, are provided on either side of each storage element and the select gates 406 and 424. In one embodiment, the substrate 490 employs a triple-well technology which includes a p-well region 492 within an n-well region 494, which in turn is within a p-type substrate region 496. The NAND string and its non-volatile storage elements can be formed, at least in part, on the p-well region. A source supply line 404 with a potential of $V_{SOURCE}$ is provided in addition to a bit line 426 with a potential of $V_{BL}$. Voltages, such as body bias voltages, can also be applied to the p-well region 492 via a terminal 402 and/or to the n-well region 494 via a terminal 403. In one embodiment, the p-well region 492 is biased during a programming operation. The n-well region 494 may be biased with the same voltage as the p-well region 492. Biasing the p-well region 492 may assist boosting during program, as will be discussed below. Assisting boosting may reduce program disturb.

During a program operation, a control gate voltage $V_{PGM}$ is provided on a selected word line, in this example, WL3, which is associated with storage element 414. Further, recall that the control gate of a storage element may be provided as a portion of the word line. For example, WL0, WL1, WL2, WL3, WL4, WL5, WL6 and WL7 can extend via the control gates of storage elements 408, 410, 412, 414, 416, 418, 420 and 422, respectively. A pass voltage, $V_{PASS}$ is applied to the remaining word lines associated with NAND string 400, in one possible boosting scheme. Some boosting schemes apply different pass voltages to different word lines, as has been described above with respect to the LSB and EASB examples. $V_{SGS}$ and $V_{SGD}$ are applied to the select gates 406 and 424, respectively.

FIG. 3A also shows one possible depletion line below the channels and source/drain regions of the NAND string 400. The depletion line may be relatively close to the channels for a NAND string currently being programmed. The depletion line may extend deeper into the substrate for a NAND string that is currently locked out from further programming. The depth of the depletion lines may impact boosting, which will be discussed in more detail below.

Figure 3B:
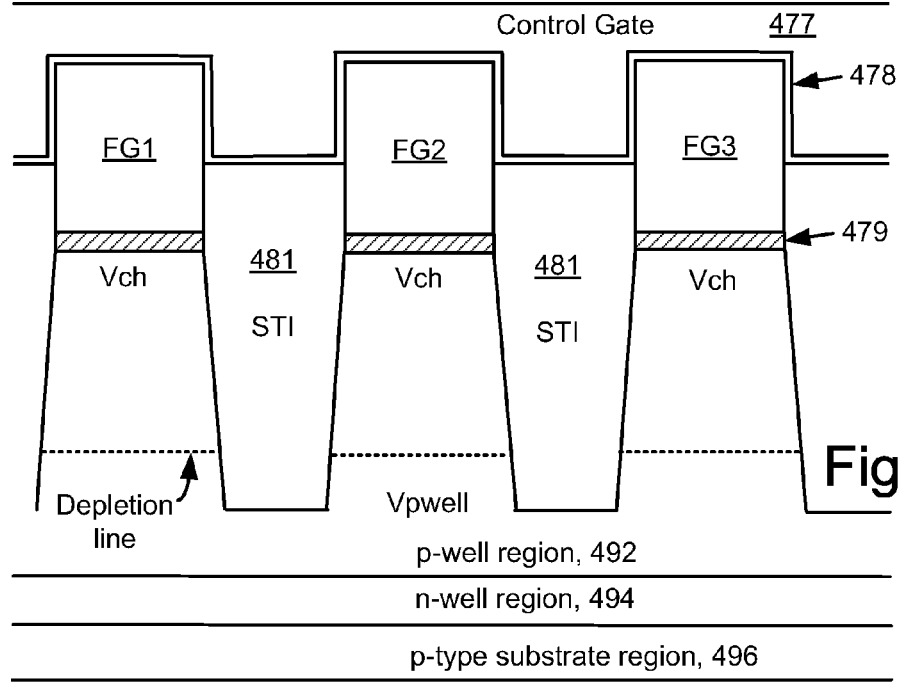
FIG. 3B and FIG. 3C depict cross-sectional views of portions of several NAND strings formed on a substrate.

FIG. 3B depicts a cross-sectional view of portions of several NAND strings formed on a substrate. The view is taken along line A-A from FIG. 3A. The view is simplified and not to scale. A control gate 477 is depicted over three floating gates (FG1-FG3) in FIG. 3B. Note that typically there may be thousands (or more) of memory cells with floating gates under a control gate. An inter-gate dielectric 478 separates the control gate 477 from floating gates. A gate dielectric 479 separates each floating gate from the substrate 490. In this example, the substrate 490 has p-well region 492, n-well region 494, and p-type substrate 496.

A shallow trench isolation (STI) structure 481 is between each memory cell. The STI 481 may serve to isolate one NAND string from the next. In particular, channel regions on one NAND string may be isolated from those on adjacent NAND strings. In one embodiment, the p-well region 492 is biased during programming. A voltage Vch is indicated in the channel region of each memory cell. A voltage Vpwell is indicated in the p-well region 492.

Depletion lines are depicted below the channels. In the example of FIG. 3B, all three NAND strings are locked out from programming ("inhibited"). In this example, the depletion lines are relatively deep into the substrate. Discussion will focus on the middle NAND string, which has FG2. This inhibited NAND string is between two inhibited NAND strings. This situation may be more favorable for boosting than if one or both neighbors are undergoing programming.

Figure 3C:
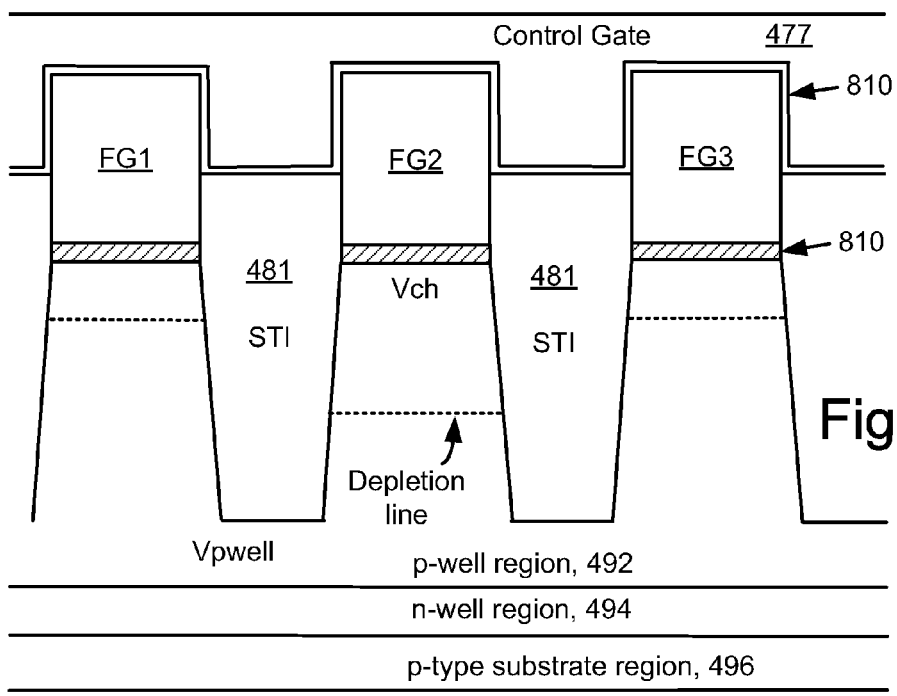

FIG. 3C is similar to FIG. 3B except the depletion lines are at different levels. In this case, the outer two NAND strings are undergoing programming. The middle NAND string (with FG2) is locked out from further programming. Note that the depletion lines are not very deep into the substrate 490 for the NAND strings undergoing programming. Also note that the depletion line for the middle NAND string is not as deep compared to those from FIG. 3B. This may be due to effects from the neighboring NAND strings that are undergoing programming. The neighboring channels may tend to "clamp" the depletion line of the middle NAND string. Note that as devices scale, such that the NAND string to NAND string spacing gets closer, the neighboring channel interference may become more severe.

The boosting efficiency of the middle NAND string in FIG. 3C may be worse than the boosting efficiency of the middle NAND string in FIG. 3B. In other words, a NAND string may have its boosting efficiency negatively impacted by one or more neighbors being programming. The situation in FIG. 3C may be worse than if only one neighbor NAND string is being programmed.

In one embodiment, the voltage that is applied to the p-well region 492 helps to improve boosting. One possible reason is that the p-well voltage helps to reduce band-to-band leakage. Note that there may be some reduction of the channel voltage (or breakdown) due to band-to-band leakage and/or other effects. Note that the voltage applied to the p-well region 492 may reduce the voltage difference between the channel and the p-well region 492. Also, the voltage applied to the p-well region 492 may reduce the voltage difference between the source/drain regions and the p-well region 492. Therefore, the p-well voltage may reduce or eliminate the band-to-band leakage. The p-well voltage may also reduce or eliminate breakdown of the boosted channel.

In one embodiment, applying the voltage to the p-well region 492 reduces the E-field in the channel region, as compared to a p-well region 492 that is not biased.

Note that in some embodiments, the p-well voltage is a positive voltage. In one embodiment, the magnitude of the p-well voltage is about 0.5 volts. However, the p-well voltage may be greater or less than 0.5 volts. Using a small, positive voltage, such as 0.5 volts may prevent forward biasing p-n junctions. For example, n+ regions of select transistors of the NAND string may become forward biased if the p-well voltage is too large.

In one embodiment, the p-well region 492 and n-well region 494 are biased to the same voltage. However, the n-well region 494 is not required to be biased to the same voltage as the p-well region 492. In one embodiment, the n-well region 494 is grounded. In one embodiment, the p-type substrate 496 is grounded while applying the bias voltage to the p-well region 492 (and possibly the n-well region 494).

Figure 4:
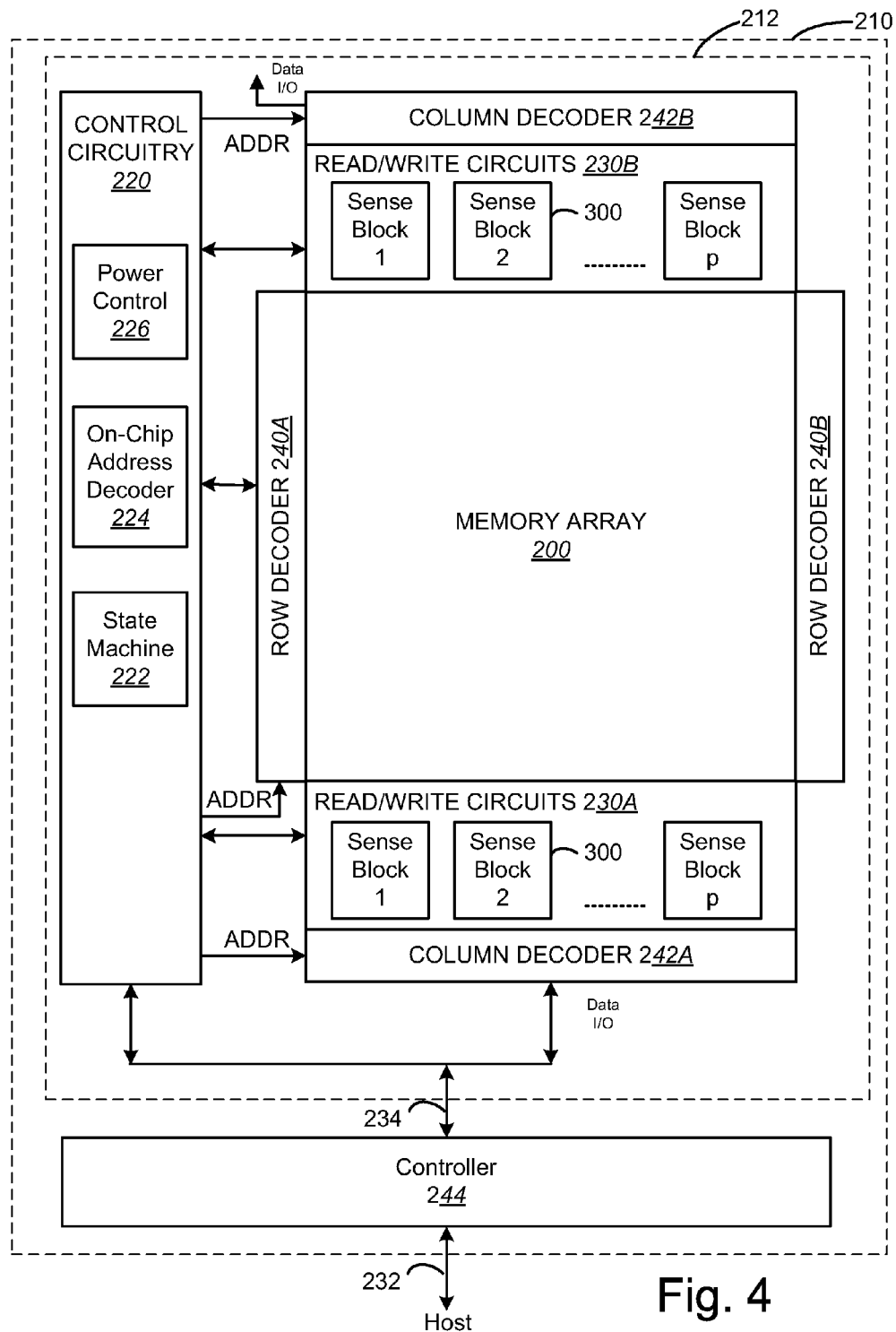
FIG. 4 illustrates a non-volatile storage device.

FIG. 4 illustrates a non-volatile storage device 210 that may include one or more memory die or chips 212. Memory die 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 200 is addressable by word lines via row decoders 240A and 240B and by bit lines via column decoders 242A and 242B. In a typical embodiment, a controller 244 is included in the same memory device 210 (e.g., a removable storage card or package) as the one or more memory die 212. Commands and data are transferred between the host and controller 244 via lines 232 and between the controller and the one or more memory die 212 via lines 234. One implementation can include multiple chips 212.

Control circuitry 220 cooperates with the read/write circuits 230A and 230B to perform memory operations on the memory array 200. The control circuitry 220 includes a state machine 222, an on-chip address decoder 224 and a power control module 226. The state machine 222 provides chip-level control of memory operations. The on-chip address decoder 224 provides an address interface to convert between the address that is used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage. The control circuitry 220 of one embodiment is able to provide Vpwell to the p-well region 492 (via terminal 402) and Vnwell to the n-well region 494 (via terminal 403).

In one embodiment, one or any combination of control circuitry 220, power control circuit 226, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits.

Figure 5A:
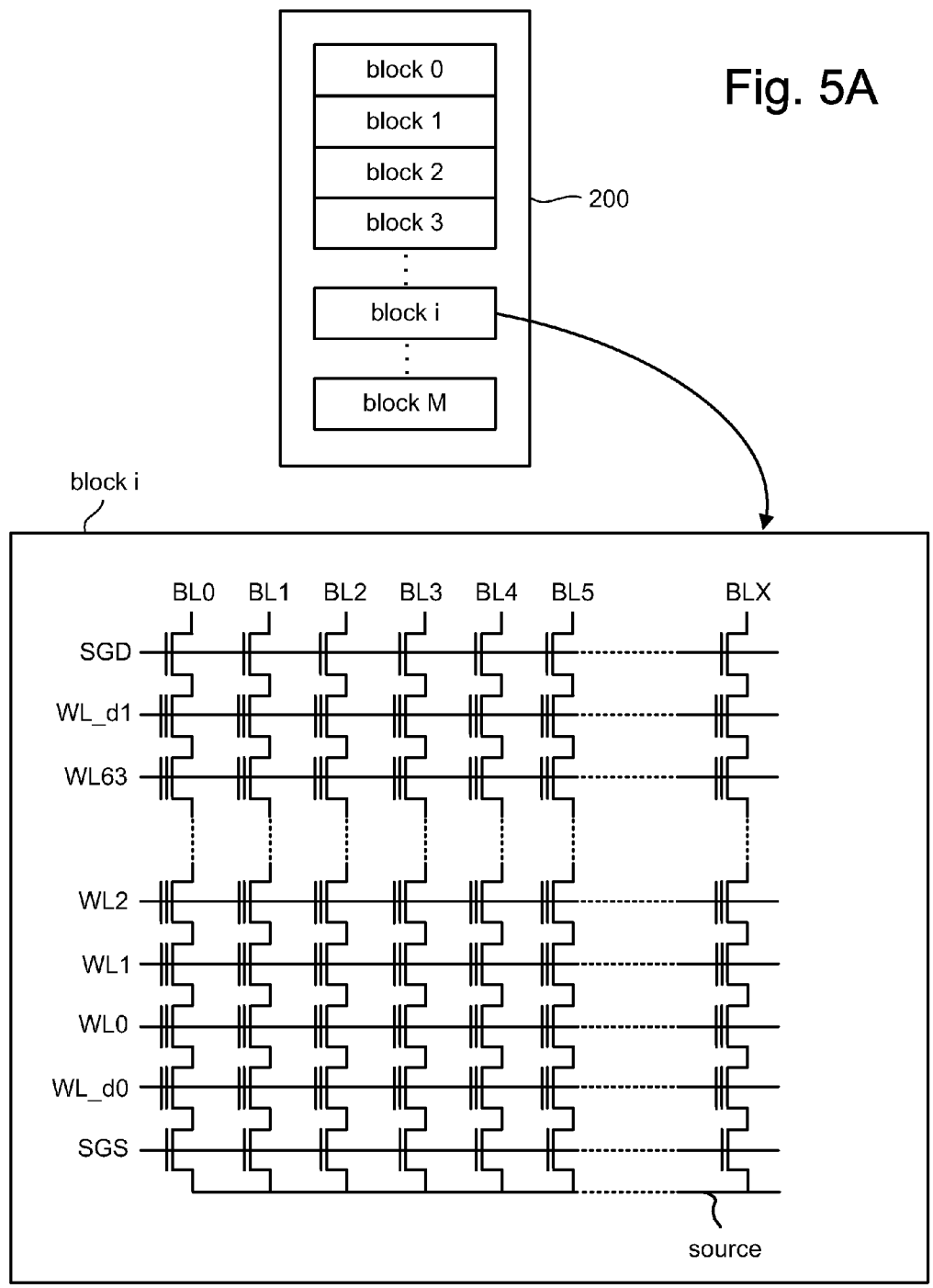
FIG. 5A depicts an exemplary structure of memory cell array.

FIG. 5A depicts an exemplary structure of memory cell array 200. In one embodiment, the array of memory cells is divided into M blocks of memory cells. As is common for flash EEPROM systems, the block is the unit of erase. That is, each block contains the minimum number of memory cells that are erased together. Each block is typically divided into a number of pages. A page is a unit of programming. One or more pages of data are typically stored in one row of memory cells. A page can store one or more sectors. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array. In one embodiment, the controller 244 is able to correct a certain number of misreads, based on the ECC.

Alternatively, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks and arrangements can also be used.

In another embodiment, the bit lines are divided into odd bit lines and even bit lines. In an odd/even bit line architecture, memory cells along a common word line and connected to the odd bit lines are programmed at one time, while memory cells along a common word line and connected to even bit lines are programmed at another time.

FIG. 5A shows more details of block i of memory array 200. Block i includes X+1 bit lines and X+1 NAND strings. Block i also includes 64 data word lines (WL0-WL63), 2 dummy word lines (WL_d0 and WL_d1), a drain side select line (SGD) and a source side select line (SGS). One terminal of each NAND string is connected to a corresponding bit line via a drain select gate (connected to select line SGD), and another terminal is connected to the source line via a source select gate (connected to select line SGS). Because there are sixty four data word lines and two dummy word lines, each NAND string includes sixty four data memory cells and two dummy memory cells. In other embodiments, the NAND strings can have more or fewer than 64 data memory cells and two dummy memory cells. Data memory cells can store user or system data. Dummy memory cells are typically not used to store user or system data. Some embodiments do not include dummy memory cells.

Figure 5B:
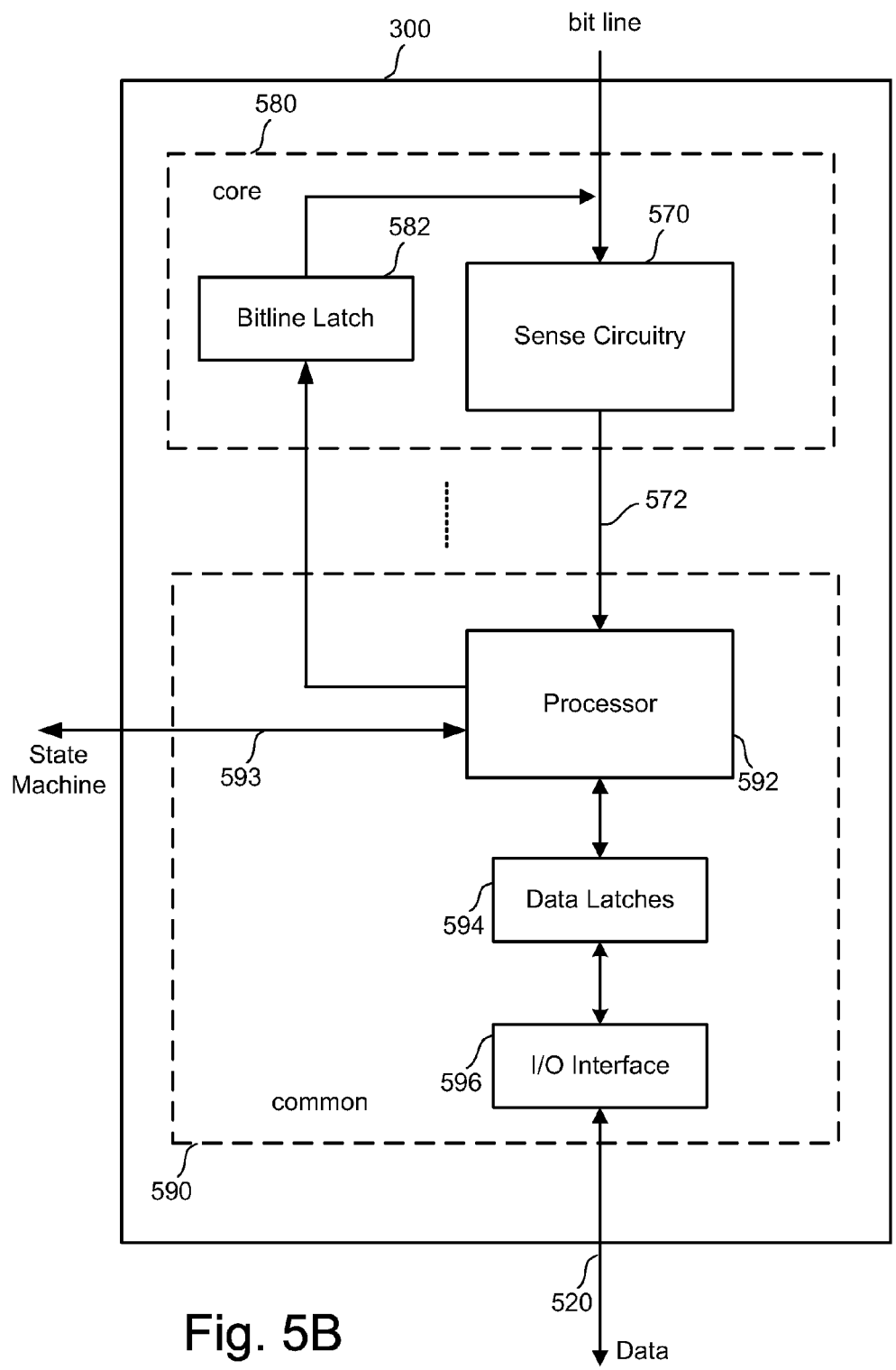
FIG. 5B is a block diagram of an individual sense block.

FIG. 5B is a block diagram of an individual sense block 300 partitioned into a core portion, referred to as a sense module 580, and a common portion 590. In one embodiment, there will be a separate sense module 580 for each bit line and one common portion 590 for a set of multiple sense modules 580. In one example, a sense block will include one common portion 590 and eight sense modules 580. Each of the sense modules in a group will communicate with the associated common portion via a data bus 572. For further details, refer to U.S. Patent Application Publication 2006/0140007, which is incorporated herein by reference in its entirety.

Sense module 580 comprises sense circuitry 570 that determines whether a conduction current in a connected bit line is above or below a predetermined threshold level. In some embodiments, sense module 580 includes a circuit commonly referred to as a sense amplifier. Sense module 580 also includes a bit line latch 582 that is used to set a voltage condition on the connected bit line. For example, a predetermined state latched in bit line latch 582 will result in the connected bit line being pulled to a state designating program inhibit (e.g., Vdd).

Common portion 590 comprises a processor 592, a set of data latches 594 and an I/O Interface 596 coupled between the set of data latches 594 and data bus 520. Processor 592 performs computations. For example, one of its functions is to determine the data stored in the sensed memory cell and store the determined data in the set of data latches. The set of data latches 594 is used to store data bits determined by processor 592 during a read operation. Data latches 594 may also used to store data bits imported from the data bus 520 during a program operation. The imported data bits represent write data meant to be programmed into the memory. I/O interface 596 provides an interface between data latches 594 and the data bus 520.

During read or sensing, the operation of the system is under the control of state machine 222 that controls the supply of different control gate voltages to the addressed cell. As it steps through the various predefined control gate voltages corresponding to the various memory states supported by the memory, the sense module 580 may trip at one of these voltages and an output will be provided from sense module 580 to processor 592 via bus 572. At that point, processor 592 determines the resultant memory state by consideration of the tripping event(s) of the sense module and the information about the applied control gate voltage from the state machine via input lines 593. It then computes a binary encoding for the memory state and stores the resultant data bits into data latches 594. In another embodiment of the core portion, bit line latch 582 serves double duty, both as a latch for latching the output of the sense module 580 and also as a bit line latch as described above.

It is anticipated that some implementations will include multiple processors 592. In one embodiment, each processor 592 will include an output line (not depicted in FIG. 5) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 592 to accumulate the results of the associated bit lines such that the state machine need only read the wired-OR line one time.

During program or verify, the data to be programmed is stored in the set of data latches 594 from the data bus 520. The program operation, under the control of the state machine, comprises a series of programming voltage pulses (with increasing magnitudes) applied to the control gates of the addressed memory cells. Each programming pulse is followed by a verify process to determine if the memory cell has been programmed to the desired state. Processor 592 monitors the verified memory state relative to the desired memory state. When the two are in agreement, processor 592 sets the bit line latch 582 so as to cause the bit line to be pulled to a state designating program inhibit. This inhibits the cell coupled to the bit line from further programming even if it is subjected to programming pulses on its control gate. In other embodiments the processor initially loads the bit line latch 582 and the sense circuitry sets it to an inhibit value during the verify process.

Data latch stack 594 contains a stack of data latches corresponding to the sense module. In one embodiment, there are 3-5 (or another number) data latches per sense module 580. In one embodiment, the latches are each one bit. In some implementations (but not required), the data latches are implemented as a shift register so that the parallel data stored therein is converted to serial data for data bus 520, and vice versa. In one embodiment, all the data latches corresponding to the read/write block of "m" memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the read operations and sense amplifiers can be found in (1) U.S. Pat. No. 7,196,931, "Non-Volatile Memory And Method With Reduced Source Line Bias Errors,"; (2) U.S. Pat. No. 7,023,736, "Non-Volatile Memory And Method with Improved Sensing,"; (3) U.S. Pat. No. 7,046,568; (4) U.S. Pat. No. 7,196,928, "Compensating for Coupling During Read Operations of Non-Volatile Memory," and (5) U.S. Pat. No. 7,327,619, "Reference Sense Amplifier For Non-Volatile Memory". All five of the immediately above-listed patent documents are incorporated herein by reference in their entirety.

At the end of a successful programming process (with verification), the threshold voltages of the memory cells should be within one or more distributions of threshold voltages for programmed memory cells or within a distribution of threshold voltages for erased memory cells, as appropriate. FIG. 6A illustrates example Vt distributions corresponding to data states for the memory cell array when each memory cell stores three bits of data. Other embodiment, however, may use more or fewer than three bits of data per memory cell. FIG. 6A shows eight Vt distributions corresponding to an Erase state and programmed states A-G. In one embodiment, the threshold voltages in the Erase state are negative and the threshold voltages in the programmed states A-G are positive. However, the threshold voltages in one or more of programmed states A-G may be negative. Some or all of the threshold voltages in the Erase state could be positive.

Between each of the data states Erase-G are read reference voltages used for reading data from memory cells. For example, FIG. 6A shows read reference voltage VrA between the erase state and the A-state, and VrB between the A-state and B-state. By testing whether the threshold voltage of a given memory cell is above or below the respective read reference voltages, the system can determine what state the memory cell is in.

At or near the lower edge of each programmed state are verify reference voltages. For example, FIG. 6A shows VvA for the A-state and VvB for the B-state. When programming memory cells to a given state, the system will test whether those memory cells have a threshold voltage greater than or equal to the verify reference voltage.

FIG. 6B illustrates that Vt distributions can partially overlap since the error correction algorithm can handle a certain percentage of cells that are in error. Note that in some embodiments, at one point in time the threshold voltage distribution may resemble FIG. 6A and at another time the threshold voltage distributions may overlap, as in FIG. 6B. For example, just after programming, the threshold voltage distribution may resemble FIG. 6A. However, over time, the threshold voltages of memory cells may shift, such that there may be overlap.

Also note that contrary to the equal spacing/width of the depicted threshold voltage distributions, various distributions may have different widths/spacings in order to accommodate varying amounts of susceptibility to data retention loss.

Figure 7:
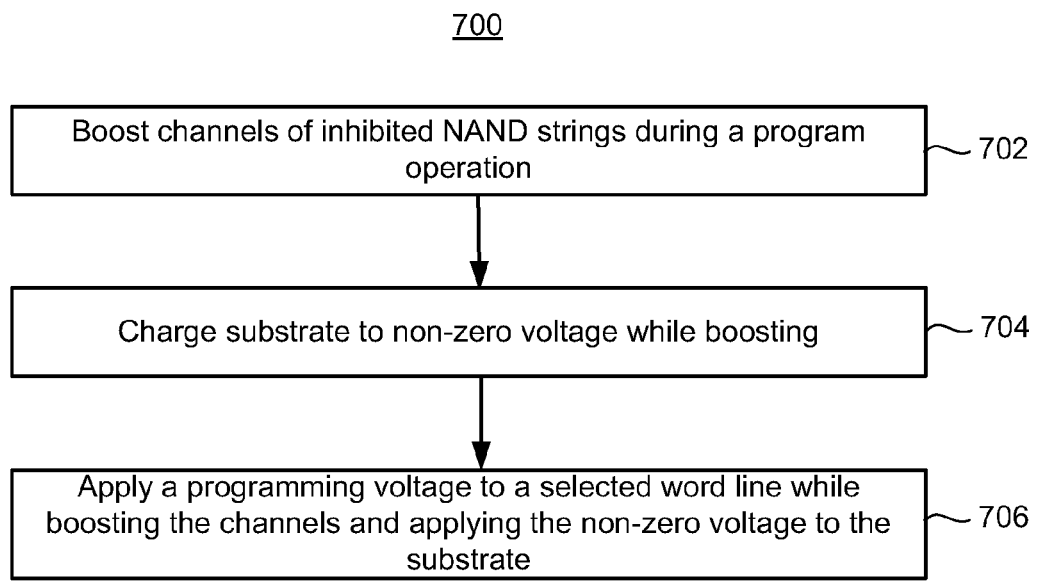
FIG. 7 is a flowchart of one embodiment of a process of programming non-volatile storage.

FIG. 7 is a flowchart of one embodiment of a process 700 of programming non-volatile storage. Process 700 applies a voltage to a substrate or well to help boosting during programming. There are numerous techniques for boosting during programming. In one embodiment, self-boosting (SB) is used. In one embodiment, local self-boosting (LSB) is used. In one embodiment, erase area self-boosting (EASB) is used.

In step 702, channels of inhibited NAND strings are boosted during a program operation. In one embodiment, a pass voltage is applied to at least a subset of unselected word lines during a program operation. The pass voltage is typically less than the program voltage. As one example, the pass voltage may be 10 volts. However, the pass voltage could be higher or lower. The pass voltage may assist in boosting channels of memory cells. In one embodiment, capacitive coupling between the control gate and channel lifts the channel potential. Thus, the pass voltage that is applied to the control gate may serve to boost the channel potential. In one embodiment, the channels of memory cells on NAND strings that are locked out from further programming may be boosted during process 700.

In one embodiment, the unselected word lines may receive different pass voltages. For example, in one LSB embodiment, many of the unselected word lines receive a Vpass of, for example, 10 V, while one or more receive a voltage less than 10V. In one EASB embodiment, many of the unselected word lines receive a Vpass of, for example, 10V, while one or more receive a voltage less than 10V. Some unselected word lines could receive a voltage greater than the normal Vpass in one embodiment.

In step 704, a substrate is charged to a non-zero voltage while boosting. In one embodiment, p-well region 492 is biased to a positive voltage. N-well region 494 may also be biased to the same voltage as the p-well region 492. The p-type substrate 496 may be grounded. Note that it is not required that the well structure of FIG. 3A be used.

As will be described in more detail below, charging the substrate 490 may aid in boosting during the program operation. Assisting boosting may help reduce or prevent program disturb. In some embodiments, charging the substrate helps reduce band-to-band tunneling, or other silicon substrate breakdown, such as avalanche, which may reduce leakage current. Note that the leakage current could otherwise reduce the channel voltage during programming. For example, the leakage current could cause the channel potential to drop over time. Therefore, by reducing the leakage current, boosting may be improved.

The positive bias on the substrate 490 may also serve increase the channel potential due to capacitive coupling. Therefore, a higher channel potential may be achieved without resorting to a higher pass voltage.

In step 706, a programming voltage is applied to a selected word line while boosting the channels and applying the non-zero voltage to substrate. In one embodiment, the programming voltage is applied while one or more pass voltages are applied to the unselected word lines and the non-zero voltage is applied to the substrate. Since biasing the substrate may serve to help increase the channel potential, the amount of program disturb may be reduced or eliminated.

Figure 8A:
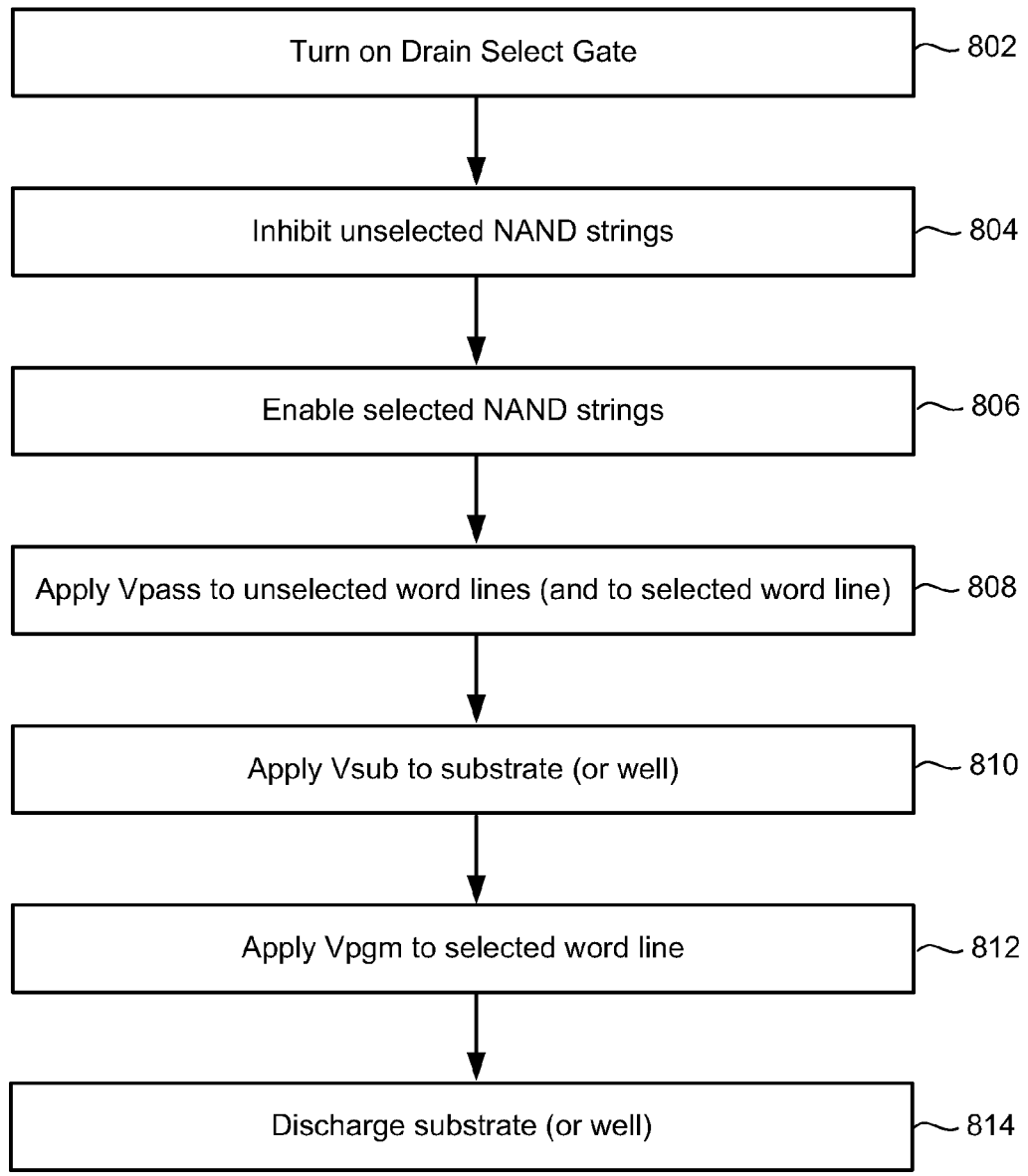
FIG. 8A provides further details of one embodiment of a process of programming non-volatile storage.
Figure 8B:
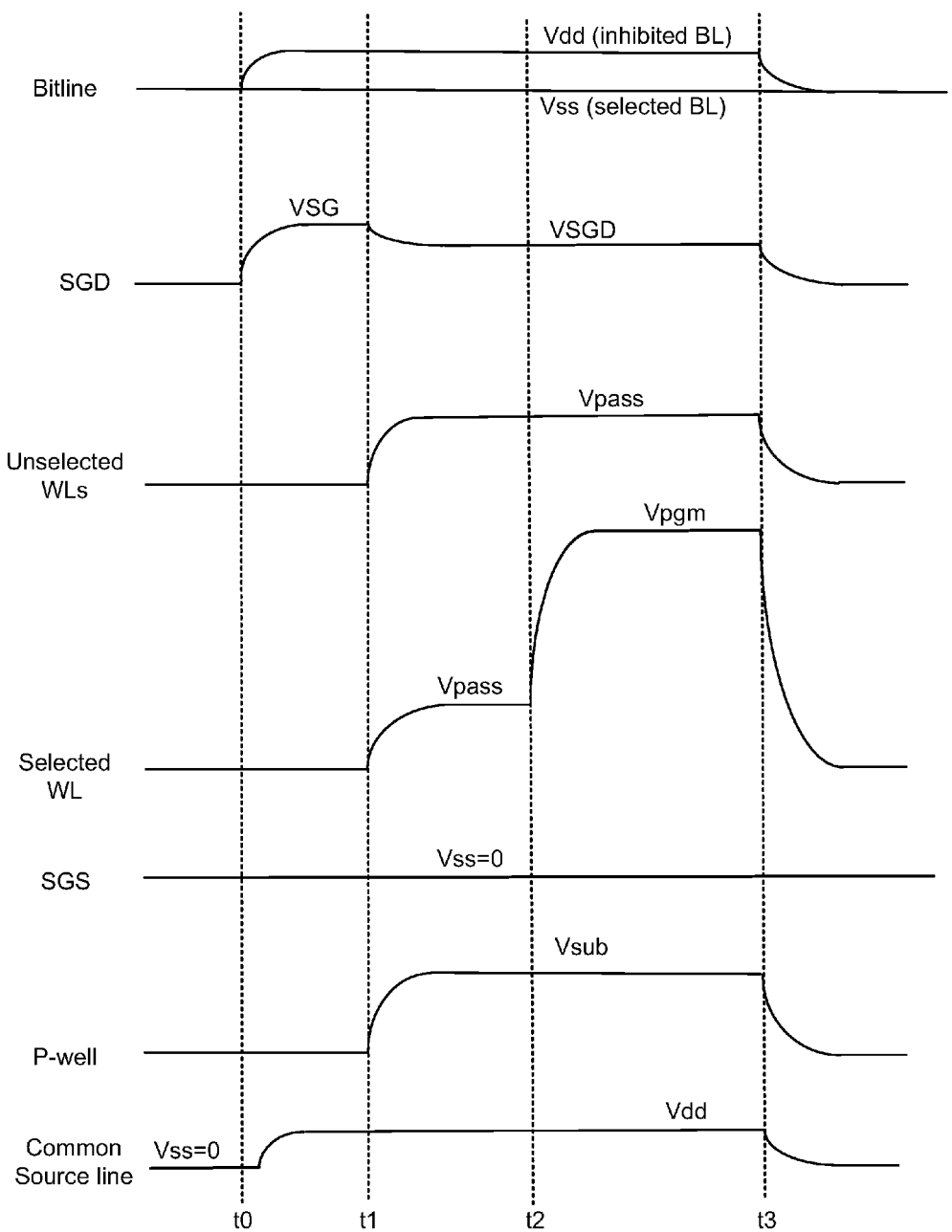
FIG. 8B depicts timing of signals during one embodiment of programming of FIG. 8A.
Figure 8C:
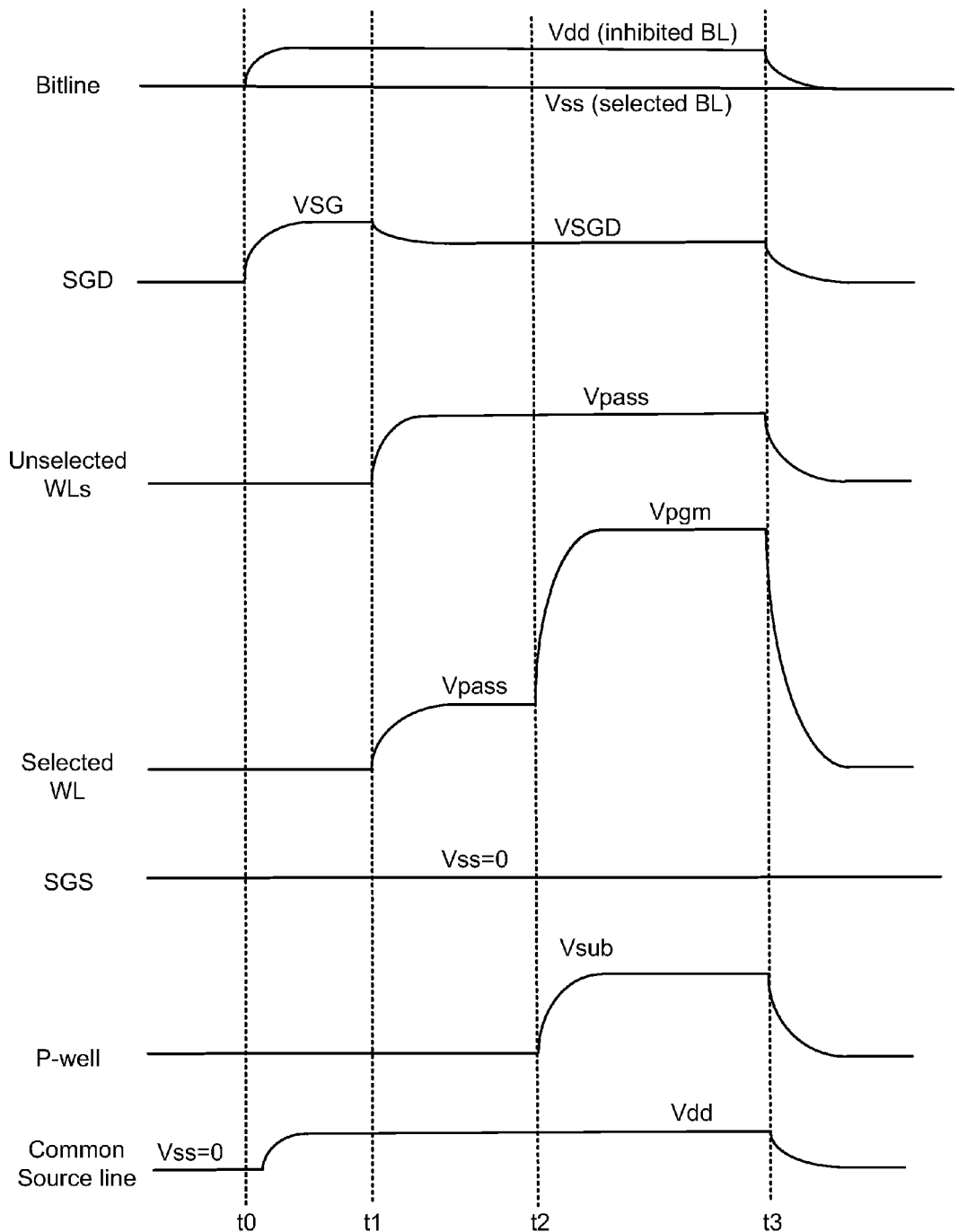
FIG. 8C depicts timing of signals during one embodiment of programming of FIG. 8A, showing a different timing of the p-well biasing compared to FIG. 8B.

FIG. 8A provides further details of one embodiment of process 700. FIG. 8B depicts timing of signals during one embodiment of process 800. FIG. 8C depicts timing of signals during one embodiment of process 800, showing a different timing of the p-well biasing compared to FIG. 8B. In process 800, the p-well region 496 is biased during a program operation that uses self-boosting (SB). Note that prior to process 800, the common source line is grounded, then ramped up to a certain voltage (e.g., 2.2V), to suppress the breakdown of the source select gate on a inhibited bit line during program operation. Also, the source select gates are off prior to process 800. If the source select gates are on, then the signal SGS is driven low to shut off the source select gates. Shutting off the source select gates disconnects the NAND strings from the common source line.

In step 802, drain side select gates of NAND strings are turned on. Referring to FIG. 8B and FIG. 8C, the drain side select line (SGD) is raised to VSG is raised at t0 to allow a sufficient channel pre-charge and back to VSGD at t1 to float the inhibited channel. Note that VSG is higher than VSGD. As note, the source side selected line (SGS) is low at t0. Also note that the p-well region may be grounded at t0. In one embodiment, the common source line is raised to Vdd just after t0, which may reduce the breakdown that the inhibited bit lines see on the source side selector.

In step 804, the unselected NAND strings are inhibited. Referring to FIG. 8B and FIG. 8C, Vdd may be applied to the unselected bit lines at time tO to inhibit their associated NAND strings from further programming. Also, the selected bit lines remain grounded at time t0, which enables further programming of their associated NAND strings.

In step 806, the selected NAND strings are enabled. This is reflected by the fact that the selected NAND strings stay at Vss.

In step 808, Vpass is applied to unselected word lines. Referring to FIG. 8B and FIG. 8C, Vpass may be applied to unselected word lines at time t1. Note that Vpass may also be applied to the selected word line at time t1. In both cases, it may take some time for the voltages to ramp up. Note that in one embodiment, the same Vpass is applied to all unselected word lines. However, in another embodiment, different Vpass voltages are applied to different unselected word lines. Step 808 is one embodiment of step 702 from FIG. 7.

In step 810, the p-well is raised to Vsub. In one embodiment, the p-well is raised to Vsub at about the same time that the unselected word lines are raised to Vpass. Referring to FIG. 8B, Vsub is first applied to the p-well at time t1. In one embodiment, the p-well is raised to Vsub at about the time that the selected word line is raised to the program voltage. FIG. 8C depicts Vsub being first applied at time t2. Note that Vsub may be first applied to the p-well at a different time in the programming sequence. Step 810 is one embodiment of step 704 from FIG. 7.

In step 812, a programming voltage, Vpgm, is applied to a selected word line. Referring to FIG. 8B and FIG. 8C, Vpgm is applied to the selected word line at time t2. Thus, the selected word line ramps us from Vpass to Vpgm. Therefore, the programming voltage is applied while boosting the channels and biasing the substrate (or well). Step 812 is one embodiment of step 706 from FIG. 7.

In step 814, the p-well (and other voltages) are brought back down. Referring to FIG. 8B and FIG. 8C, the p-well voltage is brought down at time t3. Note that other voltages may also be brought down. After the programming process, there may be a verify operation. During the verify operation, the p-well voltage may be grounded.

Figure 9A:
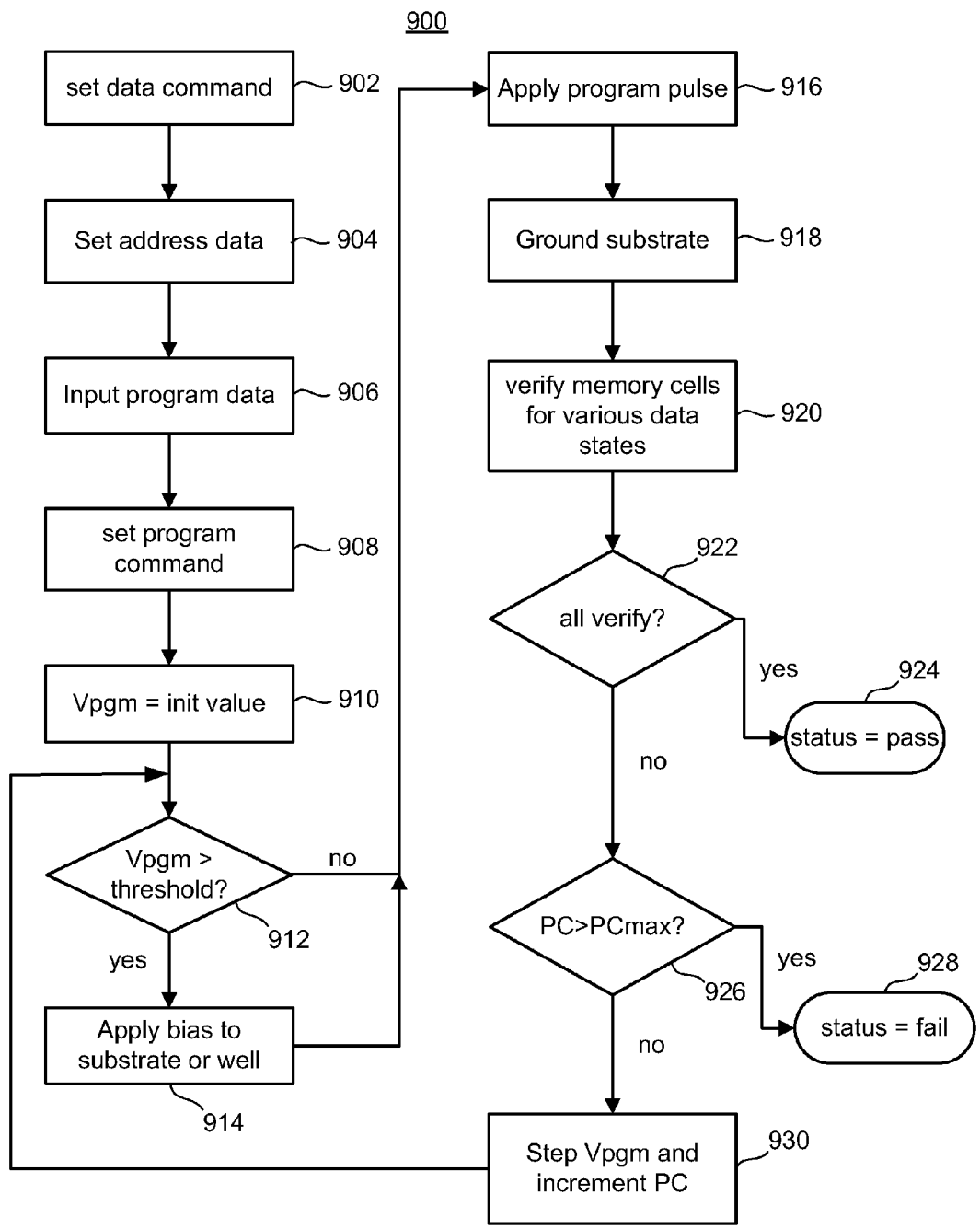
FIG. 9A is a flowchart of one embodiment of a process of programming non-volatile storage in which a substrate bias depends on a magnitude of programming voltage.
Figure 9B:
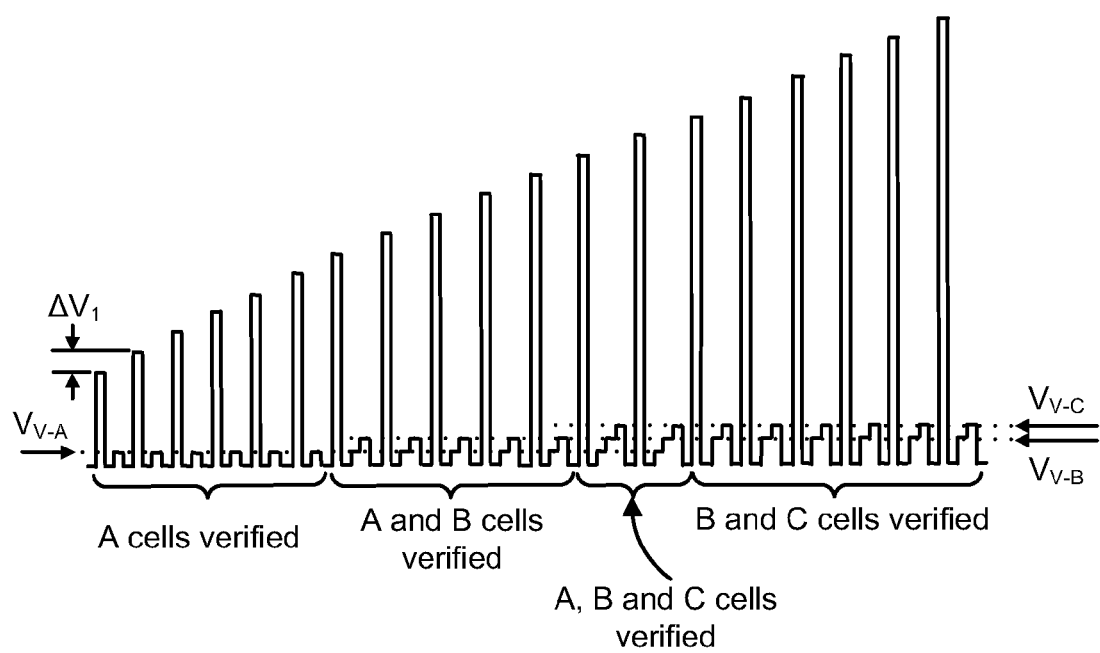
FIG. 9B is a diagram of program pulses and verify pulses that are used during one embodiment.

As noted, it is not required that all unselected word lines be biased to the same Vpass voltage during programming. In one embodiment, LSB is used. In one embodiment, EASB is used. In LSB and EASB, different unselected word lines may receive different Vpass voltages. There are many variations to LSB and EASB. FIG. 9A is a flowchart of one embodiment of a process 900 of programming non-volatile storage in which a substrate bias depends on a magnitude of programming voltage. FIG. 9B is a diagram of program pulses and verify pulses that are used during one embodiment. In that embodiment of FIG. 9B, the program pulses increase by $\Delta V1$. Between each program pulse one or more states may be verified. Initially, only memory cells being programmed to the A-state are verified. Later, both the A-state and B-state are verified. Then, the A-, B-, and C-states are verified. Next, only the B-state and C-state are verified. Numerous other verification schemes may be used. Additional states may be verified when programming to more than four states.

In one embodiment, storage elements are erased (in blocks or other units) prior to programming. In step 902 of FIG. 9A, a "data load" command is issued by the controller 244 and input received by control circuitry 220. In step 904, address data designating the page address is input to decoder 224 from the controller or host. In step 906, a page of program data for the addressed page is input to a data buffer for programming. That data is latched in the appropriate set of latches. In step 908, a "program" command is issued by the controller 244 to state machine 222.

Triggered by the "program" command, the data latched in step 906 will be programmed into the selected storage elements controlled by state machine 222 using one or more program pulses applied to the appropriate selected word line.

In step 910, the program voltage, $V_{PGM}$, is initialized to the starting pulse (e.g., 12 V or other value) and a program counter (PC) maintained by state machine 222 is initialized at zero.

In step 912, the program voltage is compared to a threshold value. If the program voltage is below or equal to the threshold, then the substrate is not biased prior to applying the program pulse in step 916. However, if the program voltage is greater than the threshold, then the substrate is biased, in step 914. Then, the program pulse is applied in step 916. FIG. 8B shows timing signals for one embodiment of steps 914-916. Note that in one embodiment, the substrate is raised to the bias voltage at about the same time that the selected word line is raised to the program voltage. Therefore, in one embodiment, the timing of FIG. 8C may be used.

Referring to step 916, the $V_{PGM}$ pulse is applied to the selected word line to begin programming storage elements associated with the selected word line. For example, for single level cell program, if logic "0" is stored in a particular data latch indicating that the corresponding storage element should be programmed, then the corresponding bit line is grounded. On the other hand, if logic "1" is stored in the particular latch indicating that the corresponding storage element should remain in its current data state, then the corresponding bit line is connected to Vdd to inhibit programming. More than one data latch may be used when multiple bits are stored in each storage element. For ease of discussion, an example of using a single data latch per storage element used in process 900.

In step 918, the substrate is grounded (e.g., discharged). Note that typically program voltages are initially lower, and then stepped up. Therefore, the substrate might not be biased for the first several program pulses. The threshold can be set to any desired amount. FIG. 8B shows one embodiment of grounding the substrate (e.g., p-well) at time t3.

In step 920, the states of the selected storage elements are verified. If the target threshold voltage of a selected storage element has reached the appropriate level, then the data stored in the corresponding data latch is changed to a logic "1." If the threshold voltage has not reached the appropriate level, the data stored in the corresponding data latch is not changed. In this manner, a bit line having a logic "1" stored in its corresponding data latch does not need to be programmed. When all of the data latches are storing logic "1," the state machine (via the wired-OR type mechanism described above) knows that all selected storage elements have been programmed. In step 922, a check is made as to whether all of the data latches are storing logic "1." If all of the data latches are storing logic "1," the programming process is complete and successful because all selected storage elements were programmed and verified. A status of "PASS" is reported in step 924. Note that in some embodiments, a certain number of memory cells are allowed to fail the verify test. The ECC can correct for these under programmed memory cells.

If, in step 922, it is determined that not all or a specific number of the data latches are storing logic "1," then the programming process continues. In step 926, the program counter PC is checked against a program limit value PCmax. One example of a program limit value is twenty; however, other numbers can also be used. If the program counter PC is not less than PCmax, then the program process has failed and a status of "FAIL" is reported in step 928. If the program counter PC is less than PCmax, then $V_{PGM}$ is increased by the step size and the program counter PC is incremented in step 930.

The process loops back to step 912 to determine whether Vpgm is greater than the threshold. At some point the magnitude of Vpgm will be greater than the threshold. Therefore, the substrate will be biased, in step 914. Programming continues until all memory cells are verified or the program counter exceeds the max.

Figure 10:
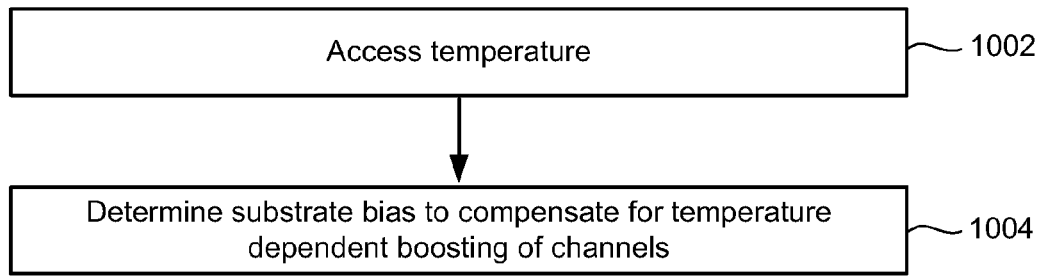
FIG. 10 is a flowchart of one embodiment of a process of determining a substrate bias voltage based on temperature.

In one embodiment the substrate bias during programming is temperature dependent. In one embodiment, the substrate bias voltage is greater for higher temperatures. This may help compensate for greater breakdown of the channel voltage at higher temperatures. As discussed above, if the channel voltage breaks down, then boosting may be less effective. FIG. 10 is a flowchart of one embodiment of a process of determining a substrate bias voltage. In step 1002, a temperature reading is accessed. In step 1004, a substrate bias is determined to compensate for temperature dependent boosting of the channels. In one embodiment, greater substrate bias is used to compensate for greater channel voltage breakdown at higher temperatures.

Figure 11:
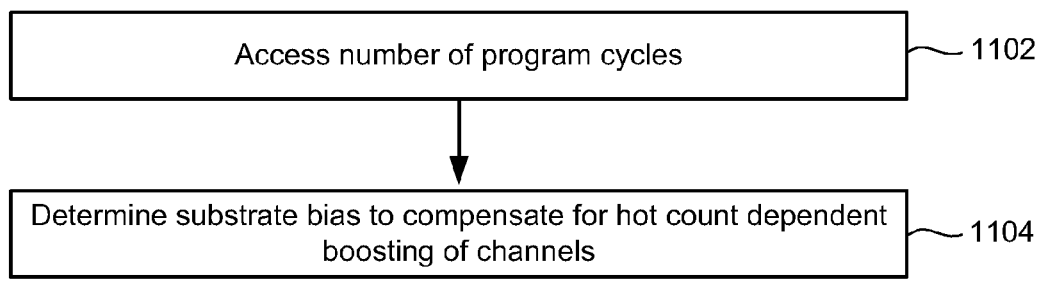
FIG. 11 is a flowchart of one embodiment of a process of determining a substrate bias voltage based on program/erase cycles.

In one embodiment, the substrate bias during programming is based on the number of program/erase cycles. In one embodiment, the substrate bias voltage is greater for higher program/erase cycles. This may help compensate for greater breakdown of the channel voltage that may occur with program/erase cycled memory devices. The program/erase cycles may also be referred to as a "hot count." FIG. 11 is a flowchart of one embodiment of a process of determining a substrate bias voltage. In step 1102, the number of program/erase cycles for a block is accessed. In another embodiment, the unit is other than a block. In step 1104, a substrate bias is determined to compensate for hot count dependent boosting of the channels. In one embodiment, greater substrate bias is used to compensate for greater channel voltage breakdown with higher number of programming cycles.

One embodiment includes a method of operating non-volatile storage having a plurality of NAND strings formed on a substrate. The method includes boosting channels of inhibited NAND strings during a program operation. The substrate is biased to a non-zero voltage while boosting the channels. A programming voltage is applied to a selected word line coupled to the plurality of NAND strings while the substrate is at the non-zero voltage and the channels are boosted.

One embodiment includes a non-volatile storage device comprising a substrate, a plurality of NAND strings having a plurality of non-volatile storage devices, a plurality of word lines associated with the plurality of NAND strings, and one or more management circuits in communication with the plurality of NAND strings and the plurality of word lines. The non-volatile storage devices have channels in the substrate. The one or more management circuits boost channels of non-volatile storage devices of inhibited NAND strings. The one or more management circuits charge the substrate to a non-zero voltage while boosting the channels. The one or more management circuits apply a programming voltage to a selected word line while the substrate is at the non-zero voltage and the channels are boosted.

One embodiment includes a non-volatile storage device, comprising a substrate, an n-well formed in the substrate, a p-well formed in the n-well, a plurality of NAND strings having a plurality of non-volatile storage devices, a plurality of word lines associated with the plurality of NAND strings, a plurality of bit lines associated with the plurality of NAND strings, and one or more management circuits in communication with the plurality of word lines and the plurality of bit lines. The plurality of non-volatile storage devices are formed over the p-well. The one or more management circuits provide a program inhibit voltage to first bit lines associated with first NAND strings of the plurality of NAND strings that have non-volatile storage elements that are not to receive further programming. The one or more management circuits provide a program enable voltage to second bit lines associated with second NAND strings of the plurality of NAND strings that have non-volatile storage elements that are to receive further programming, the one or more management circuits apply a pass voltage to at least a subset of unselected word lines of the plurality of word lines. The one or more management circuits raise the p-well to a positive voltage during a programming operation. The one or more management circuits apply a programming voltage to a selected word line while the p-well is at the positive voltage and the pass voltage is applied to the unselected word lines.

One embodiment includes a method of operating non-volatile storage having a plurality of NAND strings that includes the following. A program inhibit voltage is provided to a first set of bit lines associated with first NAND strings of the plurality of NAND strings that have non-volatile storage elements that are not to receive further programming. The plurality of NAND strings having a plurality of non-volatile storage elements that are formed over a p-well. A pass voltage to unselected word lines associated with the plurality of NAND strings. The p-well is raised to a positive voltage during a program operation. A programming voltage is applied to a selected word line while the p-well is at the positive voltage and the pass voltage is applied to the unselected word lines.

One embodiment includes a method of operating non-volatile storage having a plurality of NAND strings, which includes the following. First NAND strings of the plurality of NAND strings are cut off from their associated bit lines. The first NAND strings have non-volatile storage elements that are to be inhibited from programming. The plurality of NAND strings have a plurality of non-volatile storage elements that are formed in over a well in a substrate. A voltage on unselected word lines associated with the plurality of NAND strings is increased to a pass voltage. A voltage of selected word lines associated with the plurality of NAND strings is increased to a programming voltage while the unselected word lines are at the pass voltage. Voltage of the well is increased to a positive voltage either while increasing the voltage on the unselected word lines to the pass voltage or while increasing the voltage on the selected word line to the programming voltage. A verify operation of selected non-volatile storage elements is performed with the well grounded.

The foregoing detailed description has been presented for purposes of illustration and description. It is not intended to be exhaustive or to limit embodiments to the precise form disclosed. Many modifications and variations are possible in light of the above teaching. The described embodiments were chosen in order to best explain principles and practical application, to thereby enable others skilled in the art to best utilize the various embodiments and with various modifications as are suited to the particular use contemplated. It is intended that the scope be defined by the claims appended hereto.

What is claimed is:

1. A method of operating non-volatile storage having a plurality of NAND strings formed on a substrate, comprising:
   boosting channels of inhibited NAND strings of the plurality of NAND strings during a program operation;
   charging the substrate to a non-zero voltage while boosting the channels; and
   applying a programming voltage to a selected word line coupled to the plurality of NAND strings while the substrate is at the non-zero voltage and the channels are boosted.

2. The method of claim 1, wherein the substrate includes a well, the plurality of NAND strings are formed over the well, the charging the substrate to a non-zero voltage includes applying the non-zero voltage to the well.

3. The method of claim 2, wherein the well is a first well, the first well is in a second well, further comprising applying the non-zero voltage to the second well at least while applying the programming voltage to the selected word line.

4. The method of claim 1, wherein the boosting the channels and the charging the substrate to a non-zero voltage includes raising the substrate to the non-zero voltage while raising at least a subset of unselected word lines to a pass voltage.

5. The method of claim 1, wherein the boosting the channels and the charging the substrate to a non-zero voltage includes raising the substrate to the non-zero voltage while raising a selected word line to a program voltage.

6. The method of claim 1, wherein the non-zero voltage is a positive voltage.

7. The method of claim 1, wherein the non-zero voltage is dependent on the programming voltage.

8. The method of claim 1, wherein the non-zero voltage is used for higher programming voltages, the substrate is grounded for lower programming voltages.

9. The method of claim 1, further comprising determining the non-zero voltage to compensate for temperature dependent boosting of the channels.

10. The method of claim 1, further comprising determining the non-zero voltage to compensate for hot count dependent boosting of the channels.

11. A non-volatile storage device, comprising:
    a substrate;
    a plurality of NAND strings having a plurality of non-volatile storage devices, the non-volatile storage devices have channels in the substrate;
    a plurality of word lines associated with the plurality of NAND strings;
    one or more management circuits in communication with the plurality of NAND strings and the plurality of word lines, the one or more management circuits boost channels of non-volatile storage devices of inhibited NAND strings, the one or more management circuits charge the substrate to a non-zero voltage while boosting the channels, the one or more management circuits apply a programming voltage to a selected word line while the substrate is at the non-zero voltage and the channels are boosted.

12. The non-volatile storage device of claim 11, further comprising a well in the substrate, the charging the substrate to a non-zero voltage includes applying the non-zero voltage to the well.

13. The non-volatile storage device of claim 11, wherein the well is a first well, further comprising a second well in which the first well resides, the one or more management circuits apply the non-zero voltage to the second well while applying the non-zero voltage to the first well.

14. The non-volatile storage device of claim 11, further comprising first bit lines associated with the inhibited NAND strings, the one or more management circuits cut off the inhibited NAND strings from the first bit lines by applying an inhibit voltage to the first bit lines, the non-zero voltage is different from the inhibit voltage.

15. The non-volatile storage device of claim 11, wherein the non-zero voltage is a positive voltage.

16. The non-volatile storage device of claim 11, wherein the non-zero voltage is dependent on the programming voltage.

17. The non-volatile storage device of claim 11, wherein the one or more management circuits raise the substrate to the non-zero voltage while raising unselected word lines to a pass voltage to boost the channels.

18. The non-volatile storage device of claim 11, wherein the one or more management circuits raise the substrate to the non-zero voltage while raising a selected word line to a program voltage.

19. A non-volatile storage device, comprising:
a substrate;
an n-well formed in the substrate;
a p-well formed in the n-well;
a plurality of NAND strings having a plurality of non-volatile storage devices, the plurality of non-volatile storage devices formed over the p-well;
a plurality of word lines associated with the plurality of NAND strings;
a plurality of bit lines associated with the plurality of NAND strings;
one or more management circuits in communication with the plurality of word lines and the plurality of bit lines, the one or more management circuits provide a program inhibit voltage to first bit lines associated with first NAND strings of the plurality of NAND strings that have non-volatile storage elements that are not to receive further programming, the one or more management circuits provide a program enable voltage to second bit lines associated with second NAND strings of the plurality of NAND strings that have non-volatile storage elements that are to receive further programming, the one or more management circuits apply a pass voltage to at least a subset of unselected word lines of the plurality of word lines, the one or more management circuits raise the p-well to a positive voltage during a programming operation, the one or more management circuits apply a programming voltage to a selected word line while the p-well is at the positive voltage and the pass voltage is applied to the unselected word lines.

20. The non-volatile storage device of claim 19, wherein the one or more management circuits apply the positive voltage to the n-well while the one or more management circuits applies the positive voltage to the p-well.

21. The non-volatile storage device of claim 19, wherein the one or more management circuits ground the p-well, the one or more management circuits perform a verify operation of selected non-volatile storage elements while the p-well is grounded.

22. The non-volatile storage device of claim 19, wherein the one or more management circuits raise the p-well voltage to the positive bias voltage while the one or more management circuits raise the unselected word lines to the pass voltage.

23. The non-volatile storage device of claim 19, wherein the one or more management circuits raise the p-well voltage to the positive bias voltage while the one or more management circuits raise the selected word line to the programming voltage.

24. A method of operating non-volatile storage having a plurality of NAND strings, comprising:
providing a program inhibit voltage to a first set of bit lines associated with first NAND strings of the plurality of NAND strings that have non-volatile storage elements that are not to receive further programming, the plurality of NAND strings having a plurality of non-volatile storage elements that are formed over a p-well;
applying a pass voltage to unselected word lines associated with the plurality of NAND strings;
raising the p-well to a positive voltage during a program operation; and
applying a programming voltage to a selected word line while the p-well is at the positive voltage and the pass voltage is applied to the unselected word lines.

25. The method of claim 24, further comprising:
grounding the p-well; and
performing a verify operation of selected non-volatile storage elements with the p-well grounded.

26. The method of claim 24, wherein the raising the p-well to a positive voltage during a program operation includes:
raising the p-well voltage to the positive bias voltage while raising the unselected word line voltage to the pass voltage.

27. The method of claim 24, wherein the raising the p-well to a positive voltage during a program operation includes:
raising the p-well voltage to the positive bias voltage while raising the selected word line voltage to the programming voltage.

28. A method of operating non-volatile storage having a plurality of NAND strings, comprising:
cutting off first NAND strings of the plurality of NAND strings from their associated bit lines, the first NAND strings have non-volatile storage elements that are to be inhibited from programming, the plurality of NAND strings having a plurality of non-volatile storage elements that are formed in over a well in a substrate;
increasing a voltage on unselected word lines associated with the plurality of NAND strings to a pass voltage;
increasing a voltage of selected word lines associated with the plurality of NAND strings to a programming voltage while the unselected word lines are at the pass voltage;
increasing voltage of the well to a positive voltage either while increasing the voltage on the unselected word lines to the pass voltage or while increasing the voltage on the selected word line to the programming voltage;
grounding the well; and
performing a verify operation of selected non-volatile storage elements with the well grounded.

* * * * *